(12) United States Patent
Akram et al.

(10) Patent No.: US 8,294,273 B2
(45) Date of Patent: Oct. 23, 2012

(54) METHODS FOR FABRICATING AND FILLING CONDUCTIVE VIAS AND CONDUCTIVE VIAS SO FORMED

(75) Inventors: Salman Akram, Boise, ID (US); William Mark Hiatt, Eagle, ID (US); Steve Oliver, Boise, ID (US); Alan G. Wood, Boise, ID (US); Sidney B. Rigg, Meridian, ID (US); James M. Wark, Boise, ID (US); Kyle K. Kirby, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/985,570

(22) Filed: Jan. 6, 2011

(65) Prior Publication Data

US 2011/0095429 A1    Apr. 28, 2011

Related U.S. Application Data

(62) Division of application No. 11/347,153, filed on Feb. 3, 2006, now Pat. No. 7,892,972.

(51) Int. Cl.
 *H01L 23/48*    (2006.01)
(52) U.S. Cl. ...................................... 257/774
(58) Field of Classification Search ................. 438/667, 438/672, 675; 257/E21.577, 774
See application file for complete search history.

(56) References Cited

U.S. PATENT DOCUMENTS

| | | | |
|---|---|---|---|
| 4,954,214 A * | 9/1990 | Ho | 438/628 |
| 6,124,781 A | 9/2000 | Hogge et al. | |
| 6,165,808 A | 12/2000 | Zhang | |
| 6,410,418 B1 * | 6/2002 | Yang | 438/626 |
| 6,511,901 B1 | 1/2003 | Lam et al. | |
| 6,539,625 B2 | 4/2003 | Engel et al. | |
| 6,541,280 B2 | 4/2003 | Kaushik et al. | |
| 6,620,731 B1 | 9/2003 | Farnworth et al. | |
| 6,699,787 B2 | 3/2004 | Mashino et al. | |
| 6,770,923 B2 | 8/2004 | Nguyen et al. | |

(Continued)

FOREIGN PATENT DOCUMENTS

EP    1391924 A1    2/2004

(Continued)

OTHER PUBLICATIONS

International Search Report for International Application No. PCT/US2007/002150, mailed Aug. 31, 2007, 5 pages.

(Continued)

*Primary Examiner* — Lex Malsawma
(74) *Attorney, Agent, or Firm* — TraskBritt

(57) ABSTRACT

Methods for forming conductive vias include forming one or more via holes in a substrate. The via holes may be formed with a single mask, with protective layers, bond pads, or other features of the substrate acting as hard masks in the event that a photomask is removed during etching processes. The via holes may be configured to facilitate adhesion of a dielectric coating that includes a low-K dielectric material to the surfaces thereof. A barrier layer may be formed over surfaces of each via hole. A base layer, which may comprise a seed material, may be formed to facilitate the subsequent, selective deposition of conductive material over the surfaces of the via hole. The resulting semiconductor devices, intermediate structures, and assemblies and electronic devices that include the semiconductor devices that result from these methods are also disclosed.

27 Claims, 16 Drawing Sheets

U.S. PATENT DOCUMENTS

| | | | |
|---|---|---|---|
| 6,831,367 B2 * | 12/2004 | Sekine | 257/774 |
| 6,841,883 B1 | 1/2005 | Farnworth et al. | |
| 6,936,536 B2 | 8/2005 | Sinha | |
| 6,939,800 B1 * | 9/2005 | Lu et al. | 438/643 |
| 7,189,645 B1 * | 3/2007 | Deshmukh | 438/668 |
| 7,345,350 B2 | 3/2008 | Sinha | |
| 2002/0132469 A1 * | 9/2002 | Lee et al. | 438/628 |
| 2003/0166345 A1 | 9/2003 | Chang | |
| 2004/0137661 A1 * | 7/2004 | Murayama | 438/106 |
| 2004/0147115 A1 * | 7/2004 | Goundar et al. | 438/687 |
| 2004/0207089 A1 | 10/2004 | Masuda | |
| 2004/0245623 A1 | 12/2004 | Hara et al. | |
| 2005/0006768 A1 | 1/2005 | Narasimhan et al. | |
| 2005/0017338 A1 * | 1/2005 | Fukazawa | 257/686 |
| 2005/0064707 A1 | 3/2005 | Sinha | |
| 2005/0101040 A1 | 5/2005 | Lai et al. | |
| 2005/0118796 A1 | 6/2005 | Chiras et al. | |
| 2005/0230805 A1 | 10/2005 | Miyazawa | |
| 2005/0233591 A1 | 10/2005 | Schmitt et al. | |
| 2005/0272260 A1 | 12/2005 | Lin et al. | |
| 2005/0277293 A1 | 12/2005 | Kim et al. | |
| 2007/0184654 A1 | 8/2007 | Akram et al. | |

FOREIGN PATENT DOCUMENTS

| | | |
|---|---|---|
| EP | 1519410 | 3/2005 |
| JP | 11-067900 A | 3/1999 |
| JP | 2005-310816 A | 11/2005 |
| JP | 2007-520051 A | 7/2007 |
| KR | 1020050118904 | 12/2005 |

OTHER PUBLICATIONS

International Written Opinion for International Application No. PCT/US2007/002150, mailed Aug. 31, 2007, 8 pages.

Shibutani, Tadahiro, et al., "High-density Through-hole Interconnections in a Silicon Substrate," Fujikura Technical Review, pp. 53-56, 2004.

Search Report of the Australian Patent Office for Singapore Application No. 200805739-0, mailed Jul. 14, 2009, 6 pages.

Written Opinion of the Australian Patent Office for Singapore Application No. 200805739-0, mailed Jul. 14, 2009, 6 pages.

Search Report of the Intellectual Property Office of Singapore, Singapore Application No. 201100384-5, issued Jul. 18, 2012, seven (7) pages.

* cited by examiner

METHODS FOR FABRICATING AND FILLING CONDUCTIVE VIAS AND CONDUCTIVE VIAS SO FORMED

CROSS-REFERENCE TO RELATED APPLICATION

This application is a divisional of U.S. patent application Ser. No. 11/347,153, filed Feb. 3, 2006, now U.S. Pat. No. 7,892,972 issued on Feb. 22, 2011, the disclosure of which is hereby incorporated herein by this reference in its entirety. The subject matter of this application is also related to U.S. patent application Ser. No. 13/029,950, filed Feb. 17, 2011, pending.

BACKGROUND OF THE INVENTION

1. Field of the Invention

The present invention relates generally to techniques for forming conductive vias of semiconductor device components and, more specifically, to conductive via-forming techniques in which conductive material is selectively deposited on the surfaces of a via hole without being deposited on the major surfaces of the semiconductor device component through which the via extends. The present invention also relates to conductive vias with selectively deposited conductive layers, as well as to semiconductor device components that include the conductive vias and semiconductor device assemblies that include the semiconductor device components.

2. Background of Related Art

The parallel trends of ever-decreasing size and ever-increasing ability in the electronics industry have driven a need for semiconductor devices, semiconductor device assemblies, and semiconductor device packages of ever-decreasing size and ever-increasing feature density. One approach that has been taken to facilitate these trends has been to make as many electrical connections between components as possible in a given amount of "real estate," or area. This approach is applicable to both adjacent components and non-adjacent components.

Conductive vias have been used to provide electrical pathways between components that are superimposed relative to one another, but that are not directly adjacent to each other. A conductive via, which may be formed through a circuit board, an interposer, or a semiconductor device, provides such an electrical pathway. Conductive vias typically include a hole formed through the substrate, an insulative lining, if the substrate is formed from a semiconductive or conductive material, and a conductive element that passes through the opening, which may be electrically isolated from the substrate by way of the insulative lining. As with most features of semiconductor devices, the dimensions of the various elements of conductive vias also continue to decrease.

U.S. Pat. No. 6,841,883 to Farnworth et al. (hereinafter "Farnworth"), the entire disclosure of which is hereby incorporated herein, in its entirety, by this reference, describes exemplary processes for forming conductive vias through semiconductor device structures. In current state-of-the-art processes for fabricating conductive vias, via holes are lined with materials with low dielectric constants, such as parylene and the fluoropolymer resins (including, but not limited to, polytetrafluoroethylene ("PTFE"), fluorinated ethylenepropylene ("FEP"), ethylene-tetrafluoroethylene ("ETFE"), chlorotrifluoroethylene ("CTFE"), and perfluoroalkoxyalkane ("PFA"), which are marketed by E.I. du Pont de Nemours and Company under the trademark TEFLON®).

Although these and similar materials may be used to form very thin insulative coatings on the surfaces of via holes, they do not adhere well to the materials (e.g., silicon) of many substrates through which via holes are formed or to the conductive materials that are subsequently introduced into the via holes to form an electrically conductive via.

The low adhesion of such dielectric materials, as well the potential for misalignment when multiple masks are used to form and passivate via holes may result in shorting between a conductive via and the substrate through which the conductive via extends.

In addition, some of the processes that are currently used to fabricate conductive vias are complex, require expensive materials or equipment that is not widely used in semiconductor device fabrication processes, or are otherwise undesirable.

Accordingly, there are needs for processes for fabricating conductive vias with state-of-the-art dimensions and capabilities while employing common semiconductor device fabrication techniques.

SUMMARY OF THE INVENTION

The present invention includes a variety of aspects for fabricating conductive vias through a substrate, as well as semiconductor device components including the conductive vias and intermediate structures.

A method for forming one or more conductive vias includes forming one or more via holes. The via holes may extend fully or partially through a substrate, such as a semiconductor device, an interposer, or another semiconductor device structure. The via holes may be formed with a single mask, eliminating the potential for misalignment between different sections of a via hole, which are formed through layers of different materials. The via holes may be formed or subsequently processed in such a way as to facilitate adhesion of materials that are subsequently introduced therein to the surfaces thereof. Such processing may include providing via hole surfaces with roughened features or other features that enhance the surface areas thereof.

Alternatively, such processing may include the formation of a dielectric coating that includes one or more films that improve adhesion of a material having a low dielectric constant to one or both of the material at the surfaces of the via holes and the conductive material that will subsequently be introduced into the via holes.

The dielectric coating may be formed in such a way as to extend onto an edge of a bond pad that is continuous with a via hole, thereby reducing the potential for electrical shorting between a subsequently fabricated conductive via and the material of the substrate through which the conductive via extends.

A layer or film of barrier material may also be formed over the surfaces of each via hole. By way of example only, the barrier material may prevent interdiffusion between a conductive material and the material of an insulative coating or of the substrate through which the via hole extends.

Conductive material may be introduced into the via hole by a variety of processes. For example, a seed material coating or other "base layer" may be formed and, if necessary, patterned to remove seed material from undesired regions of a semiconductor device structure (e.g., the major surfaces of the semiconductor device structure). The seed material facilitates selective growth of conductive material at desired locations, such as over the surfaces of each via hole. Thus, once the seed material coating covers only desired portions of a semiconductor device structure, the conductive material may be selectively introduced into the via holes and over any other desired locations of the semiconductor device structure (e.g., on a bond pad through which a via hole extends and with which the conductive via will communicate).

Further, more complete filling of the via hole may then be accomplished with a filler material. If desired, the surface of the conductive via may be made flush with one or more features of the semiconductor device component.

Once a conductive via has been formed in accordance with teachings of the present invention, conductive material at the blind end of the via hole and, thus, at the blind end of the conductive via, may be exposed by removing material from the back side of the substrate. The semiconductor device component may then be assembled with and electrically connected to one or more other semiconductor devices in any suitable manner.

Other features and advantages of the present invention will become apparent to those of ordinary skill in the art through consideration of the ensuing description, the accompanying drawings, and the appended claims.

BRIEF DESCRIPTION OF THE DRAWINGS

In the drawings, which depict exemplary embodiments of various aspects of the present invention:

FIGS. 1, 2, and 4 depict an example of a process for forming a via hole completely through a substrate;

DETAILED DESCRIPTION

A semiconductor device structure 10 according to the present invention may, without limitation, comprise a semiconductor device (e.g., a memory device, such as a dynamic random access memory ("DRAM"), static random access memory ("SRAM"), Flash memory, electrically-erasable programmable memory ("EEPROM"), magnetic random access memory ("MRAM"), etc.; a microprocessor; a microcontroller; an imaging device; or any other type of semiconductor device), another electronic component that may be fabricated by semiconductor device fabrication techniques, or a substrate (e.g., an interposer, a circuit board, etc.).

Figure 1:
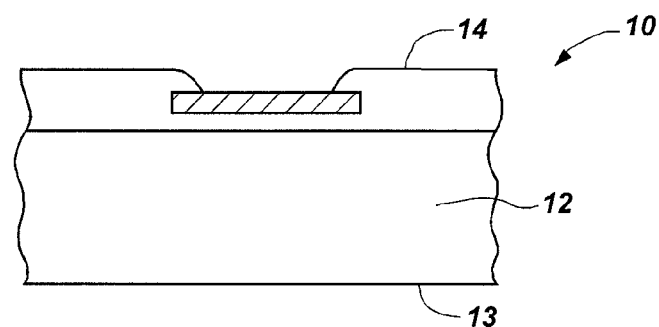
FIGS. 1 through 3 illustrate an example of a technique for forming a via hole partially through a substrate.

As FIG. 1 illustrates, a semiconductor device structure 10 according to the present invention includes a substrate 12 with an active surface 14 and a back side 13 opposite from active surface 14. Substrate 12 may comprise a full or partial wafer of semiconductor material (e.g., silicon, gallium arsenide, indium phosphide, etc.), a semiconductor-on-insulator ("SOI") type substrate (e.g., silicon-on-glass ("SOG"), silicon-on-sapphire ("SOS"), silicon-on-ceramic ("SOC"), etc.), or even a dielectric (e.g., glass, sapphire, ceramic, polymer, resin, etc.) or metal substrate.

Semiconductor device structure 10 may be processed to form one or more conductive vias that extend partially into or completely through substrate 12. Processes of the present invention may be effected at the "wafer level" or "wafer scale," prior to separation of adjacent components from one another, as described in Farnworth.

Figure 2:
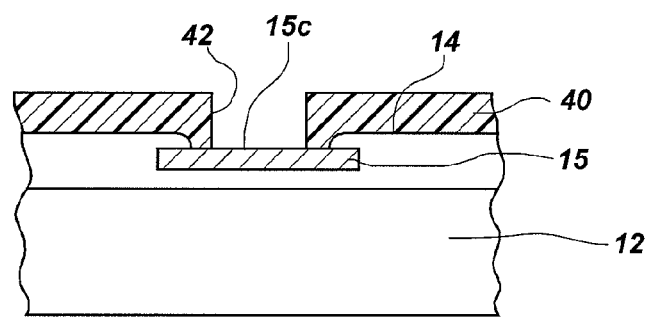

With reference to FIG. 2, in forming via holes 20 (FIG. 3) through substrate 12, a mask 40 may be formed over a surface (e.g., active surface 14) of substrate 12. Mask 40 may be formed by known processes. For example, a photoresist may be disposed on active surface 14 of substrate 12, selectively exposed through a reticle, then developed, baked, or otherwise processed, as known in the art, to form a photo resist mask, or "photomask."

Apertures 42 of mask 40 are positioned so as to facilitate material removal from portions of one or more upper bond pads 15 that are carried by active surface 14 of substrate 12 and, thus, the formation of via holes 20 (FIG. 3) through upper bond pads 15. Apertures 42 may be configured so as to form via holes 20 with desired cross-sectional shapes (e.g., circular, square, etc.).

Figure 3:
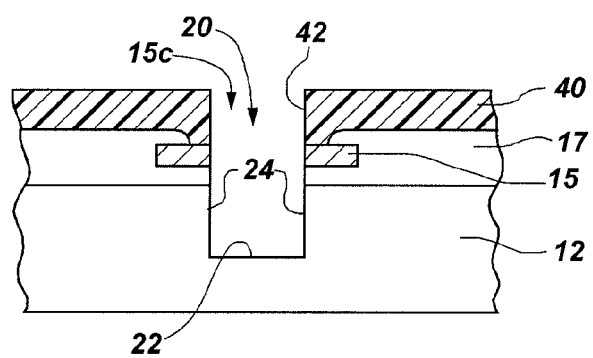

As shown in FIG. 3, via holes 20 may be formed through upper bond pads 15 and into substrate 12 by exposing the portions (e.g., center portions 15c in FIG. 2) of upper bond pads 15 and substrate 12 that are exposed through apertures 42 to one or more etchants suitable for removing the material of upper bond pads 15, substrate 12, and any intervening material layers. While the etchant or etchants that are used to form via holes 20 may be isotropic (i.e., etch in all directions at substantially the same rate) or anisotropic (i.e., not isotropic), anisotropic etchants are particularly useful for forming via holes 20 with high aspect ratios (i.e., height-to-width, or cross-sectional dimension ratios). Material may be removed from substrate 12 through apertures 42 of mask 40 until via holes 20 of desired depth have been formed. Alternatively, known laser drilling processes may be used, with or without a mask, to form via holes 20 in substrate 12.

A single mask 40 may be used in the process shown in FIG. 3. For example, a first etchant may be used to remove material of upper bond pads 15 through apertures 42. A second etchant or solvent may be used to remove material (e.g., borophosphosilicate glass (BPSG), a polymer, etc.) of one or more protective layers 17 that laterally surround and may underlie upper bond pad 15 through apertures 42, prior to the complete removal of mask 40. As mask 40 may be partially or substantially removed while upper bond pads 15 and protective layer 17 are etched, protective layer 17 and the remaining portions of upper bond pads 15 may then serve as a mask through which material (e.g., silicon) of substrate 12 is removed. Of course, the etchant or etchants that are used to remove material of substrate 12 are selective for the material of substrate 12 over the materials of upper bond pads 15 and protective layer 17 (i.e., the etchant removes the material of substrate 12 at a faster rate than the materials of upper bond pads 15 and protective layer 17). The use of a single mask 40 prevents misalignment of the sections of a via hole 20 that extend through different materials.

The resulting via holes 20 may comprise blind via holes, as illustrated, which do not extend fully through substrate 12 and, thus, include blind ends 22. Blind via holes 20 facilitate vacuum handling of semiconductor device structure 10 or a fabrication substrate (not shown) by which semiconductor device structure 10 is carried during fabrication of conductive vias through semiconductor device structure 10.

Figure 4:
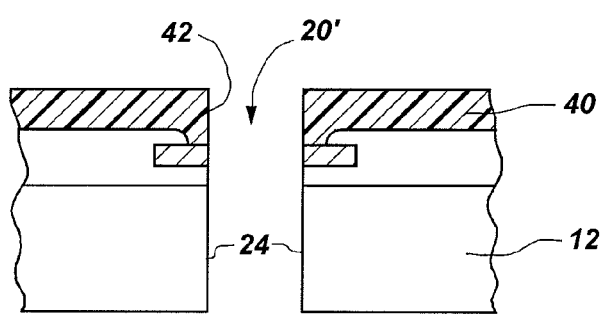

Alternatively, as depicted in FIG. 4, open via holes 20', which extend completely through substrate 12, may be formed by removing the material of substrate 12 through apertures 42 of mask 40.

If a photomask was used as mask 40 to facilitate material removal from selected locations of upper bond pads 15, substrate 12, and any other material layers or features of semiconductor device structure 10, the photomask may be removed once the material removal processes have been completed.

Surface 24 or surfaces of each via hole 20, 20' may be sufficiently rough to facilitate adhesion of materials thereto. Such roughness may be achieved through the material removal process by which via holes 20, 20' are formed, or by subsequent processing. For example, without limiting the scope of the present invention, via holes 20, 20' may be formed by a tetramethylammonium hydroxide ("TMAH") wet etch (e.g., 9:1 $H_2O$:TMAH), a wet etch with $NH_4F$ (ammonium fluoride), $H_2O_2$ (hydrogen peroxide), and $C_6H_8O_7$ (citric acid) (e.g., 1:1:1 $NH_4F$:$H_2O_2$: $C_6H_8O_7$), with an $SF_6$ plasma etch, by a deep silicon reactive ion etch ("RIE"), or the like. Alternatively, via holes 20, 20' that have been formed by other processes may be roughened by use of a suitable roughening technique, such as one of the just-described etch techniques.

Figure 5:
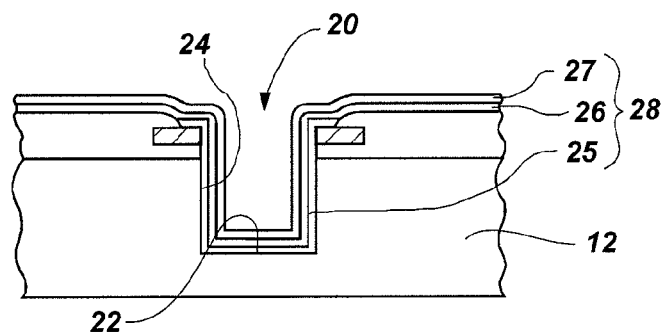
FIGS. 5 and 6 depict an example of a process for passivating surfaces of a via hole.

With reference to FIG. 5, if substrate 12 is formed from a semiconductor material or a conductive material, surfaces 24 of via holes 20 may be lined or coated with dielectric material to form a dielectric coating 28, which prevents electrical shorting as electrical currents are conveyed along circuitry that extends into or through via holes 20. The thickness of dielectric coating 28 may be tailored to position a subsequently formed conductive via at a desired location relative to a surface 24 or blind end 22 of via hole 20.

As a nonlimiting example, dielectric coating 28 may include a parylene, a low-silane oxide ("LSO") (which is deposited by chemical vapor deposition ("CVD") at a relatively low temperature), a material layer (e.g., an aluminum-rich oxide, etc.) that has been deposited by pulsed deposition processes and, thus, is referred to as a pulsed deposition layer ("PDL"), or any combination of dielectric materials or layers may be applied to or deposited onto exposed surfaces of substrate 12 by known processes (e.g., spin coating, spraying, programmed material consolidation processes (e.g., those effected by the systems available from Objet Geometries, Ltd., of Rehovot, Israel, 3D Systems Corporation of Valencia, Calif., etc.), CVD, thermal growth, spin-on dielectric ("SOD") techniques (e.g., spin-on glass ("SOG" processes), etc.). Examples of processes for forming dielectric layers are disclosed in U.S. Pat. Nos. 6,770,923 and 6,541,280, as well as in U.S. Patent Publication Nos. US 2005/0006768, US 2002/0137317 and US 2002/0137250, the disclosures of each of which are hereby incorporated herein, in their entireties, by this reference.

If desired, portions of dielectric coating 28, for example, portions that cover upper bond pads 15 or other locations of active surface 14, may be subsequently removed. Suitable techniques for selectively removing various regions of dielectric coating 28 include, but are not limited to, dry etch processes and wet etch processes. For example, spacer etch techniques, in which the etch process is effected at a low pressure that imparts ions with a direction energy that removes material from horizontal surfaces without substantially removing it from vertical surfaces, may be used to selectively remove portions or, pattern, dielectric coating 28. Such processes may be timed or an end-point detected to prevent undesired removal of materials from within via holes 20 (e.g., from surfaces 24). Other techniques for selectively removing regions of dielectric coating 28 may be effected with or without a mask (e.g., a photomask, which may be sprayed on, for example, by sonic dispense processes), which substantially fills via holes 20 and through which upper bond pads 15 are exposed, with active surface 14 either shielded by or exposed through the mask. When a mask is used, wet or dry, isotropic or anisotropic etch processes may be used to pattern dielectric coating 28. Of course, once dielectric coating 28 has been patterned, the mask may be removed (e.g., by known resist strip techniques). As another alternative, planarization or polishing processes, such as chemical-mechanical planarization ("CMP") may be used to remove dielectric coating 28 from active surface 14 and surfaces of upper bond pads 15.

In forming a dielectric coating 28 on surface 24 of via hole 20, surface 24 of via hole 20 may first be coated with a first adhesion layer 25 comprising an oxide, such as a silicon oxide. The oxide of first adhesion layer 25 may be formed by any suitable process, including by deposition using tetraethylorthosilicate ("TEOS"), thermal growth processes, or low-temperature oxidation processes. First adhesion layer 25, if present, may facilitate adhesion of a material having an even lower dielectric constant ("K") over surface 24 of via hole 20.

A dielectric material having a relatively low dielectric constant (e.g., K≈2) may be deposited directly onto surface 24 of each via hole 20 or onto first adhesion layer 25 that coats at least portions of surface 24. Of course, the processes that are used to form dielectric layers 26 are compatible with the material or materials from which dielectric layers 26 are to be formed, as well as the materials or structures over which the dielectric material is to be formed or deposited. Examples of low-K dielectric materials that may be deposited over surface 24 include, but are not limited to, parylenes (e.g., PARYLENE HT®), TEFLON®, and other dielectric materials with low dielectric constants that may be deposited on features (e.g., within via holes 20) with relatively high aspect ratios to form relatively thin dielectric layers 26.

An optional, second adhesion layer 27 may be formed over dielectric layer 26 to facilitate adhesion of conductive materials over the surface 24 of each via hole 20. Like first adhesion layer 25, second adhesion layer 27 may comprise an oxide, such as a silicon oxide. Any suitable process may be used to form adhesion layer 27, including, without limitation, deposition of the material of second adhesion layer 27 (e.g., with TEOS when second adhesion layer 27 comprises a silicon oxide).

Figure 6:
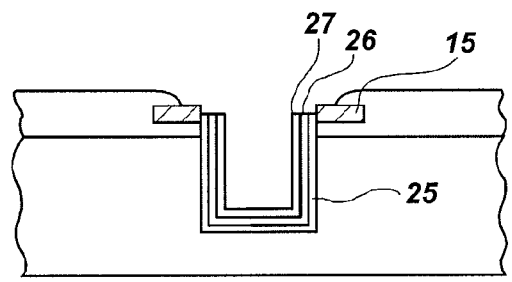

Portions of first adhesion layer 25 (if present), dielectric layer 26, and second adhesion layer 27 (if present) that overlie each upper bond pad 15 may be removed therefrom to facilitate communication between subsequently formed conductive structures and upper bond pad 15. The removal of the dielectric materials of these layers 25, 26, or 27 may be effected simultaneously/sequentially, as shown in FIG. 6, or immediately following the formation of each sequential layer 25, 26, or 27.

Layers 25, 26, 27 may be referred to hereinafter, individually or in any combination, as "dielectric coating 28."

Figure 7:
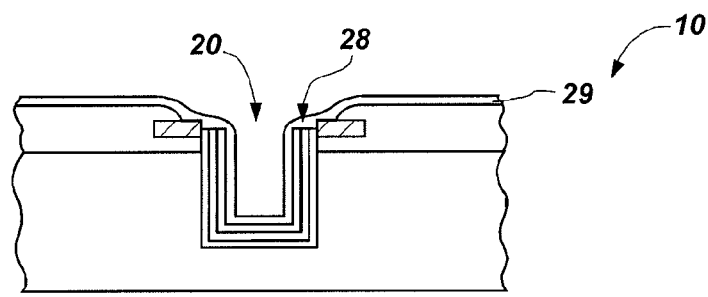
FIGS. 7 and 8 show fabrication of a barrier layer over surfaces of a via hole.

Referring now to FIG. 7, a barrier layer 29 may be formed over dielectric coating 28. Barrier layer 29 is particularly useful for preventing undesirable reactions between copper conductors within via holes 20 and the exposed material of dielectric coating 28 or substrate 12. Suitable materials from which barrier layer 29 may be formed include, without limitation, titanium (Ti), titanium nitride (TiN), tantalum (Ta), tantalum nitride (TaN), and other materials that prevent interdiffusion and spiking between copper and silicon and silicon-containing materials.

Figure 8:
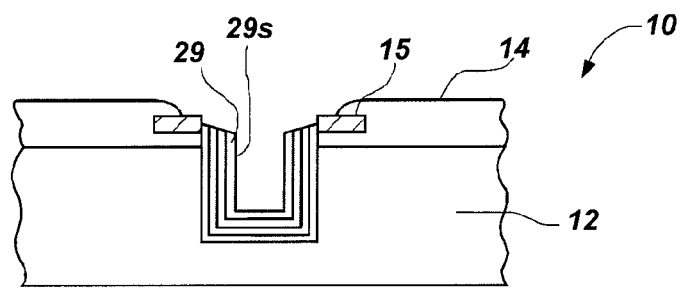

As illustrated, barrier layer 29 may be formed by so-called "blanket" deposition processes, in which upper exposed surfaces (e.g., active surface 14, surfaces exposed within via hole 20, etc.) of semiconductor device structure 10 are coated with the material of barrier layer 29. To facilitate the subsequent, selective deposition of conductive material, for example, on upper bond pads 15 and surfaces 29s of barrier layer 29, as depicted in FIG. 8, the material of barrier layer 29 may be removed from locations of semiconductor device structure 10 or substrate 12 thereof (e.g., active surface 14) where deposition of conductive material could be problematic (e.g., cause electrical shorting) or is otherwise not desired. The removal of unwanted barrier material may be effected by a variety of known processes, including, but not limited to, spacer etching, polishing or planarization techniques (e.g., mechanical polishing, chemical-mechanical polishing ("CMP"), etc.), or otherwise, as known in the art.

Figure 9:
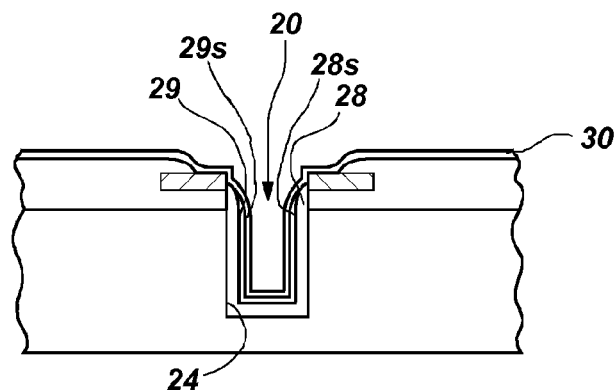
FIGS. 9 and 10 illustrate the formation and optional patterning of a seed material coating over surfaces of a via hole.

Surfaces 24, 28s, 29s of via holes 20, dielectric coating 28, or barrier layer 29, respectively, may be at least partially coated with a seed material, which will facilitate subsequent growth of a desired conductive material on surfaces 24, 28s, or 29s, as shown in FIG. 9. Of course, the seed material of the resulting coating 30 facilitates growth or deposition of one or more desired types of conductive materials over surfaces 24, 28s, or 29s. For example, when surface 24, 28s, or 29s is to be lined with copper, the seed material coating 30 may itself comprise copper. A copper seed material coating may be formed by any suitable deposition technique, such as a physical vapor deposition ("PVD") process (e.g., sputtering) or a CVD process. As another example, any suitable process (e.g., PVD, CVD, etc.) may be used to form an aluminum film on surface 24, 28s or 29s.

Figure 10:
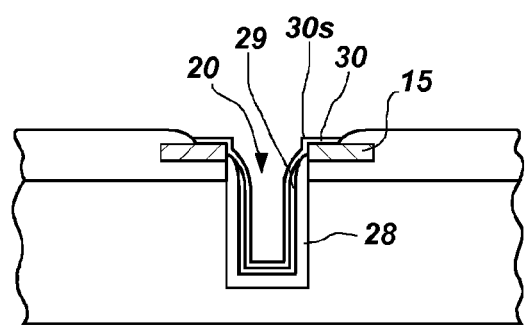

When blanket deposition techniques are used to form coating 30, the seed material may cover all of the exposed surfaces of semiconductor device structure 10, including areas where subsequent deposition of conductive material is not desired (e.g., areas other than upper bond pads 15 and surface 24, 28s, 29s). Accordingly, as illustrated in FIG. 10, portions of seed material coating 30 may be removed from these areas. Any suitable technique may be used for this purpose, including, without limitation, known polishing or planarization techniques.

When via holes 20 are to be filled with copper, as an alternative to separately removing barrier layer 29 and seed material coating 30 from some of the surfaces of semiconductor device structure 10, as shown in FIGS. 8 and 10, a single removal process may be used to remove both seed material coating 30 and barrier layer 29. This single removal process may comprise any process suitable for removing barrier material and seed material from undesired locations on the exposed surface or surfaces of semiconductor device structure 10, while leaving barrier material and seed material at locations where subsequent growth or deposition of conductive material is desired (e.g., on upper bond pads 15, on surfaces 24, 28s, 29s (FIG. 9) within via holes 20, etc.). Exemplary removal processes include, but are not limited to, known spacer etch techniques, polishing or planarization techniques, and the like.

Once seed material coating 30 has been formed and patterned, conductive material (e.g., a metal, conductor-filled polymer, etc.) may be selectively deposited on or otherwise applied to a surface 30s thereof to form a conductive layer 32 over surfaces 24 of via holes 20 and, optionally, over upper bond pads 15 or portions thereof, as shown in FIGS. 11 through 14. By way of nonlimiting example, known electroless plating, immersion plating, or electrolytic plating techniques may be used. Conductive material may be deposited until conductive layer 32 reaches a desired thickness, in which case a void 34 (FIGS. 11 and 14) may remain within via hole 20, or until via hole 20 is completely filled; i.e., no void remains within via hole 20.

Figure 11:
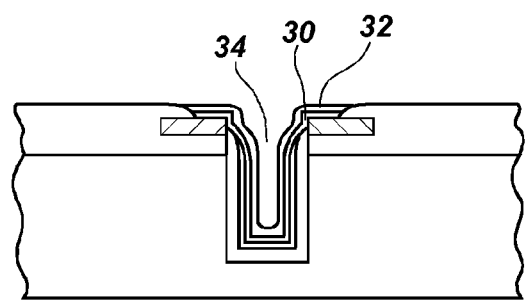
FIG. 11 represents selective deposition of a conductive layer over surfaces of a void that remains within a via hole.

FIG. 11 illustrates selective deposition of a conductive layer 32 on seed material coating 30. For example, copper may be selectively deposited (e.g., by electroless or immersion plating; e.g., with the chemistry available from Pac Tech GmbH of Nauen, Germany) onto a seed material coating 30 that also comprises copper. Alternatively, a conductive layer 32 comprising nickel may be selectively deposited (e.g., by electroless or immersion plating; e.g., with the chemistry available from Pac Tech) on a seed material coating 30 that comprises aluminum.

Figure 13:
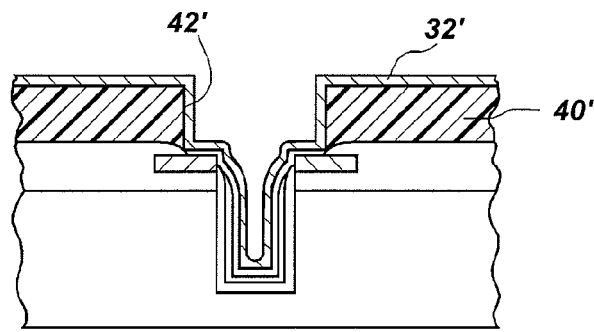
Figure 14:
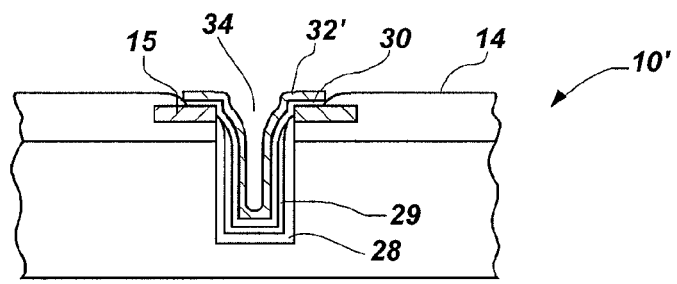

As an alternative to selective techniques for depositing conductive material to form conductive layers 32 over surfaces 24 of via holes 20, nonselective deposition processes may be employed. An exemplary method for forming conductive layers 32' by nonselective deposition processes is shown in FIGS. 12 through 14.

Figure 12:
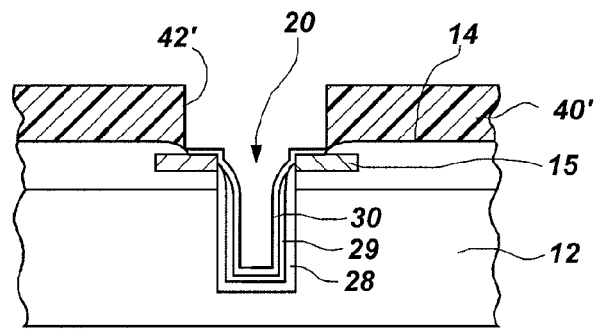
FIGS. 12 through 14 illustrate an example of a technique that employs nonselective deposition processes to form a conductive layer over the surfaces of a via hole.

In FIG. 12, a mask 40' is formed over active surface 14 by known processes. For example, and not to limit the scope of the present invention, mask 40' may comprise a photomask that is formed by applying a photoresist over active surface 14, selectively exposing the photoresist, developing the photoresist, removing undeveloped photoresist, then baking the photoresist. Mask 40' includes apertures 42' that are aligned over via holes 20 that have been formed within substrate 12, lined with one or more dielectric material layers or coatings (e.g., dielectric coating 28 or sublayers thereof, including, without limitation, adhesion layers 25 and 27 and dielectric layer 26 (see FIGS. 5 and 6)), optionally coated with a barrier layer 29, and optionally including a seed material coating 30. Apertures 42' need not expose entire upper bond pads 15, as upper bond pads 15 may include a material or materials that facilitate adhesion of a desired material thereto.

As mask 40' will physically separate portions of a subsequently formed conductive layer 32', as shown (FIG. 13), from portions of each of the aforementioned layers that overlie non-upper bond pad 15—bearing regions of active surface 14 of substrate 12, portions of seed material coating 30, the optional barrier layer (not shown), and dielectric coating 28 that overlie non-upper bond pad 15—bearing regions of active surface 14 need not be removed prior to the formation of conductive layer 32'.

Conductive layer 32' may be formed by any suitable process, including, but not limited to, PVD, CVD, electrolytic plating, electroless plating, and immersion plating techniques. Such a deposition or plating process may be used to form conductive layer 32' on surfaces of seed material coating 30 that are exposed through aperture 42' of mask 40' and, when the deposition process is not selective, on exposed surfaces of mask 40'. By way of nonlimiting example, a conductive layer 32' comprising nickel may be formed on a seed material coating 30 that comprises copper. The nickel may be deposited onto mask 40' and portions of seed material coating 30 that are exposed through aperture 42' by any suitable process, such as an electrolytic, electroless, or immersion plating process.

Thereafter, as depicted in FIG. 14, mask 40' may be removed by suitable processes. Continuing with the example of a photomask, any suitable mask-strip process may be employed. As mask 40' (FIG. 13) is removed from semiconductor device structure 10', any portions of conductive layer 32' that previously overlied mask 40' are "lifted off" of semiconductor device structure 10'.

If undesired portions of seed material coating 30, or barrier layer 29 were not previously removed from exposed surfaces of semiconductor device structure 10' (e.g., from non-upper bond pad 15—bearing regions of active surface 14), suitable processes may be used to remove one or more of these layers or coatings following the removal of mask 40'. In addition to the aforementioned techniques for removing these layers or coatings, removal processes (e.g., use of wet or dry etchants in appropriate processes) with selectivity for the materials of the layers or coatings over the material of conductive layer 32' may be employed.

Figure 15:
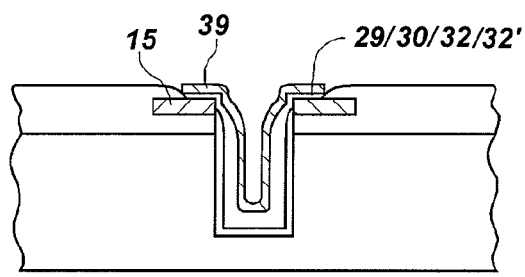
FIG. 15 is a representation of a semiconductor device structure that includes an electrically conductive, oxidation-resistant film over at least a portion of a barrier layer, seed material coating, or conductive layer that extends onto a bond pad of the semiconductor device structure.

Optionally, as depicted in FIG. 15, if any of conductive layer 32, 32', seed material coating 30, or barrier layer 29 extends onto upper bond pads 15 and the material of conductive layer 32, 32', seed material coating 30, or barrier layer 29 forms an oxide, which is not compatible with processes for subsequently securing conductive elements (e.g., bond wires, solder balls, leads, conductive elements of tape-automated bonding ("TAB") substrates, etc.) to upper bond pads 15, an electrically conductive, oxidation resistant coating 39 may be formed on conductive layer 32, seed material coating 30, or barrier layer 29. Oxidation resistant coating 39 may, for example, comprise aluminum, gold, platinum, or any other oxidation resistant material that is compatible with the material of conductive layer 32, 32'. Oxidation resistant coating 39 may be formed by a selective (e.g., electroless or immersion plating) or non-selective (e.g., CVD, PVD, etc.) deposition process. If a non-selective deposition process is used, oxidation resistant coating 39 may be patterned by known processes (e.g., use of mask and etch processes, mask and lift-off processes, etc.).

Figure 16:
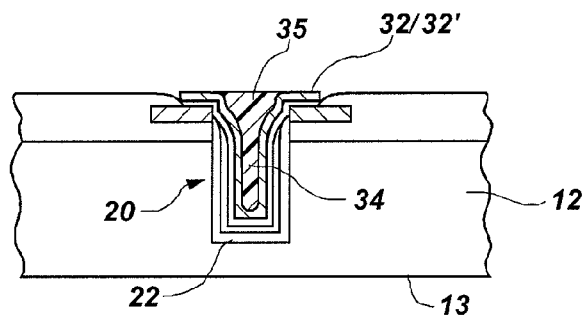
FIG. 16 illustrates an exemplary process for filling a void that remains within a via hole with a dielectric filler material.

With reference to FIG. 16, if, following the formation of conductive layer 32, 32', a void 34 remains within via hole 20, a filler material 35 may be introduced into void 34. Filler material 35 may comprise a conductive material, such as the same type of material use to form conductive layer 32, 32' (e.g., a metal) or a material that is compatible with the material of conductive layer 32, 32' (e.g., another metal, a metal alloy, a conductive polymer, conductor-filled polymer, etc.), or a dielectric material (e.g., a polymer). Filler material 35 in a liquid state (e.g., molten metal, heated thermoplastic polymer, uncured polymer, etc.) may be introduced into void 34 by any suitable process. For example, a known "backfilling" process, in which filler material 35 is mechanically forced into void 34, may be used. Alternatively, if a vent (not shown) has been formed between blind end 22 of via hole 20 and a back side 13 of substrate 12, filler material 35 may be drawn into void 34 by capillary action or under a negative pressure (e.g., a vacuum), or forced into void 34 under positive pressure.

Figure 17:
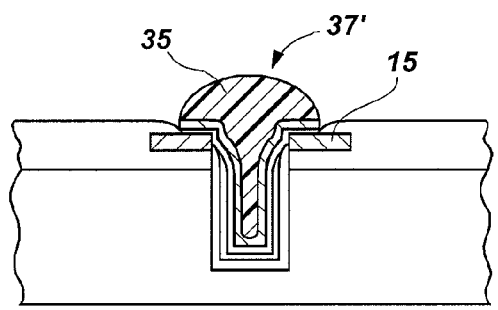
FIGS. 17 and 18 each show another example of a process for filling a void that remains within a via hole with a dielectric filler material.
Figure 18:
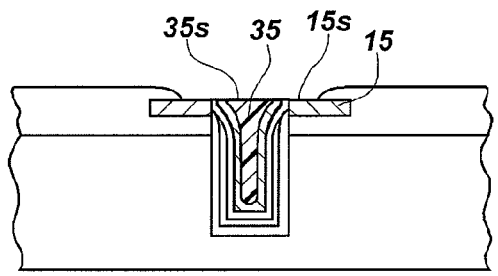

While a bump 37' may be formed by a dielectric filler material 35, as shown in FIG. 17, such a bump 37' may prevent a conductive structure from being secured to and establishing adequate electrical communication with upper bond pad 15. Accordingly, as illustrated in FIG. 18, dielectric bumps 37' may be removed from over surfaces of upper bond pad 15 and, thus, dielectric filler material 35 may have an upper surface 35s that is flush, or substantially coplanar, with the surface 15s of each upper bond pad 15.

Figure 19:
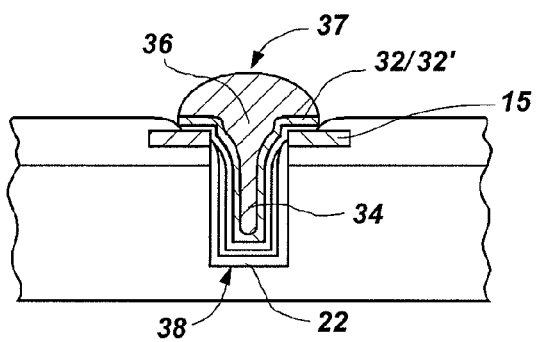
FIG. 19 is a depiction of a void in a via hole that has been filled with a conductive material.

Alternatively, as depicted in FIG. 19, a conductive via 38 may be completed by filling void 34 with a conductive material. In the illustrated example, a conductive filler 36 (e.g., a solder, such as tin/lead (Pb/Sn) solder, a so-called "lead-free solder," such as a copper/tin/silver (Cu/Sn/Ag), tin/copper (Sn/Cu), tin/silver (Sn/Ag), or gold/tin (Au/Sn) alloy), or other suitable conductive material) may be introduced into void 34 to fill the same and, optionally, to form a bump 37 on upper bond pad 15.

As yet another alternative, voids 34 may remain within the conductive via 38, avoiding the stresses (e.g., mismatched coefficients of thermal expansion, mismatched electrical conductivities or resistivities, etc.) that may be caused by introducing dielectric or conductive material therein.

Figure 20:
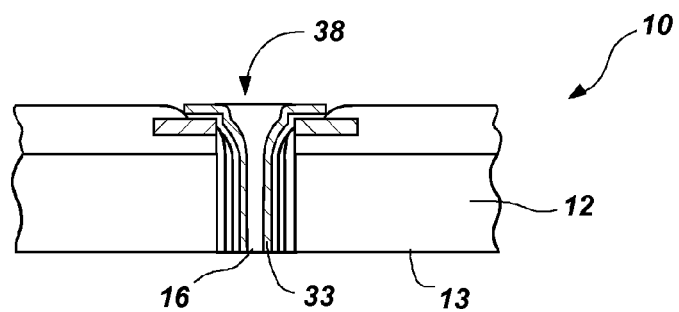
FIG. 20 illustrates removal of material from the back side of a substrate to expose conductive layers at or near a blind end of a via hole.

As illustrated in FIG. 20, blind ends 22 (FIG. 19) of via holes 20 and, thus, of conductive vias 38 may be exposed through back side 13 of substrate 12 by removing material from back side 13 of substrate 12. Of course, any suitable technique may be used to expose blind ends 22. For example, a so-called "back grinding" process may be used to remove material from a back side 13 of substrate 12 until a bottom portion 33 of conductive layer 32, which is located at blind ends 22 (see FIGS. 16 and 19), is exposed, as illustrated, or until a partial or full cross-section of the various layers of conductive via 38 is exposed. The exposed bottom portion 33 of conductive layer 32 of each conductive via 38 forms a bottom bond pad 16 of semiconductor device structure 10.

Back side 13 may be subsequently processed to passivate the same, to form larger bond pads at the bottom ends of conductive vias 38, as well as to form conductive traces that extend laterally to other bond pad locations, and other features, as desired.

The following examples describe various examples of processes that may be used to form various embodiments of conductive vias that extend into or through semiconductor device components.

Example 1

With reference to FIGS. 21 through 27, an example of a process that may be used to form via holes 20 in a substrate 12 and insulate, or passivate, surfaces 24 thereof is described.

Figures 21, 22:
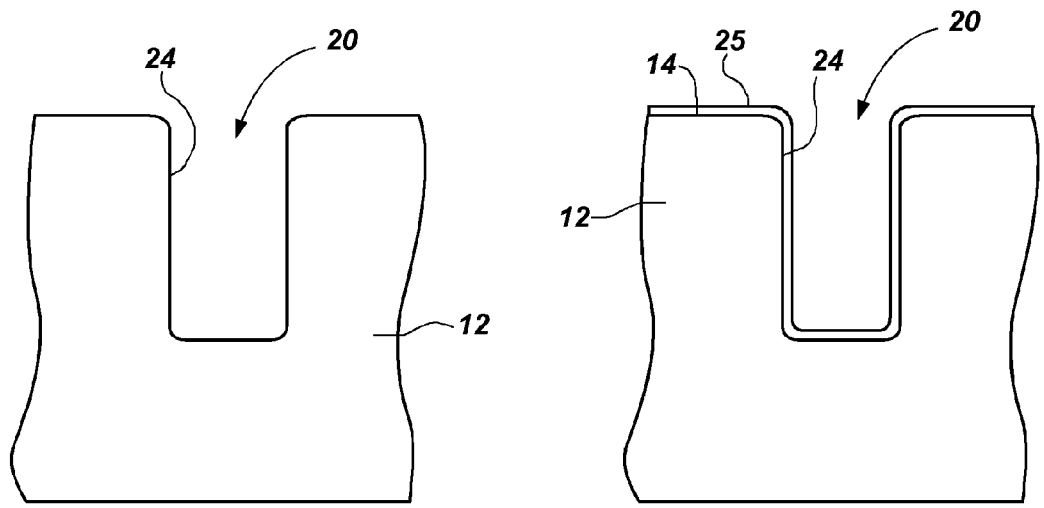
FIGS. 21 through 24 are cross-sectional representations showing acts in an example of a process for forming a via hole and coating, or passivating, surfaces of the via hole with dielectric material.

In FIG. 21, a via hole 20 is formed in substrate 12. While via hole 20 is depicted as extending only partially through substrate 12 and is, thus, known in the art as a "blind via hole," via hole 20 may alternatively extend completely through substrate 12. Via hole 20 may be formed by any suitable process, including, without limitation, by use of a mask through which one or more etchants selectively remove material of substrate 12, by laser ablation techniques, or otherwise, as known in the art.

While FIGS. 21 through 27 depict the process of example 1 as being useful for forming conductive vias that extend through "blind" areas of substrate 12, which do not include integrated circuitry or bond pads, these processes may also be used to form conductive vias that extend through bond pads that are located over either blind or active areas of substrate 12.

As shown in FIG. 22, a first adhesion layer 25 is formed on surface 24 of via hole 20 and on an active surface 14 of substrate 12. Adhesion layer 25 may be formed by any suitable process, such as a deposition process (e.g., pulsed layer deposition ("PLD") (which forms a PDL), CVD, atomic layer deposition ("ALD"), a process for forming an LSO, etc.), as a thermal oxide, by a low-temperature oxidation process, such as that disclosed in U.S. Pat. No. 6,165,808, issued to Zhang on Dec. 26, 2000, the disclosure of which is hereby incorporated by this reference as is set forth in its entirety herein, or otherwise, as known in the art.

Figures 23, 24:
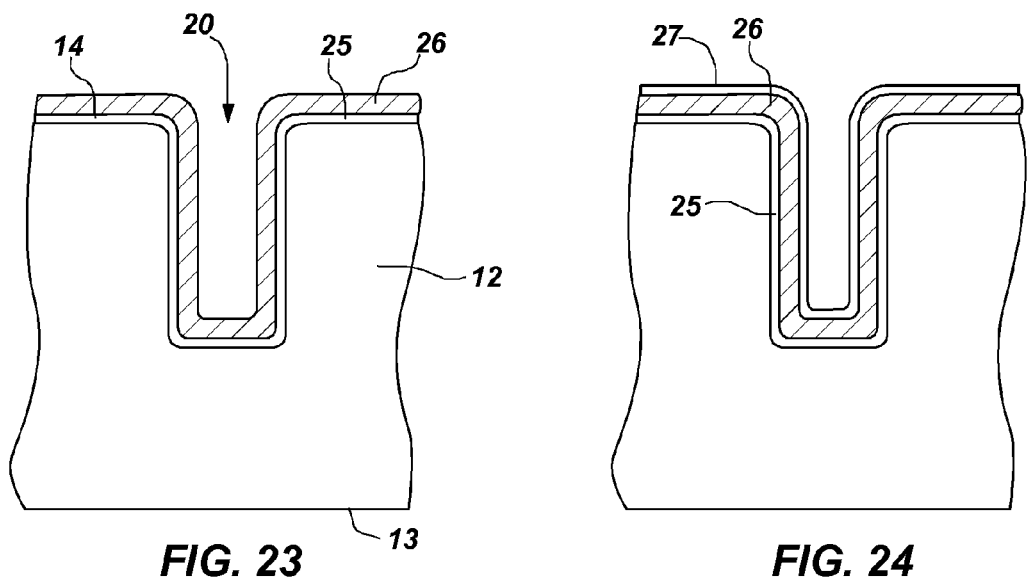

Known processes are then used to deposit a layer 26 comprising low-K dielectric material, such as parylene, TEFLON®, or the like, over first adhesion layer 25, as depicted in FIG. 23. Due to the low-K of the material or materials from which dielectric layer 26 is formed, it may be relatively thin, facilitating the fabrication of via holes 20 with relatively large aspect ratios and, thus, increasing the potential density of conductive vias that may be included on substrate 12 per a given area over active surface 14 or back side 13 thereof.

As the material from which dielectric layer 26 is formed may not adhere well to many conductive materials, another, second adhesion layer 27, formed from a material that will adhere to both the material of dielectric layer 26 and a subsequently deposited material, may be formed over dielectric layer 26, as shown in FIG. 24. Second adhesion layer 27 comprises a dielectric material (e.g., a silicon oxide) and may be formed by known processes, such as suitable PLD or LSO techniques.

Figure 25:
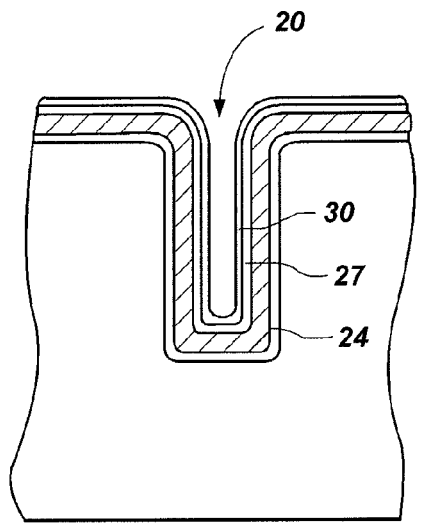
FIGS. 25 through 27 illustrate examples of the deposition and patterning of a seed material coating over surfaces of a via hole.

Next, as shown in FIG. 25, a conductive layer, which may also be referred to as "seed material coating 30," or as a "metal mask," is formed over second adhesion layer 27. In this example 1, seed material coating 30 is formed by depositing tungsten over second adhesion layer 27. Tungsten is useful for facilitating the subsequent formation of nickel over surface 24 of via hole 20.

Figure 26:
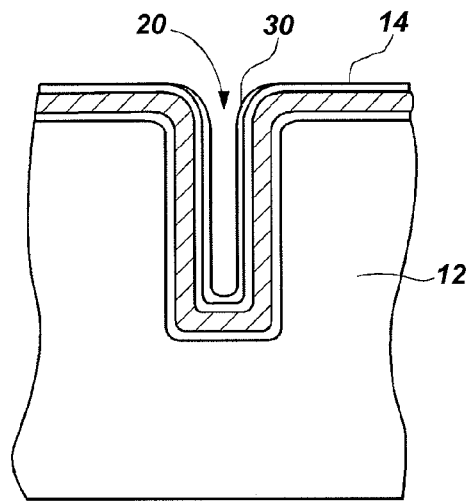

Portions of seed material coating 30 that overlie active surface 14 of substrate 12 are removed, as illustrated in FIG. 26. These portions may be removed by any suitable process, including the use of so-called "spacer etch" techniques, which will not remove significant portions of seed material coating 30 located within via hole 20.

Figure 27:
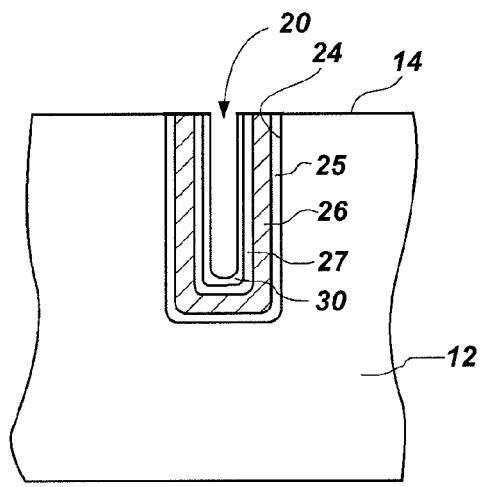

Thereafter, as depicted in FIG. 27, exposed portions of second adhesion layer 27 (i.e., those overlying active surface 14 of substrate 12) are removed. Again, any suitable removal processes may be used, such as a selective wet etch (i.e., the etchant has selectivity for the material of second adhesion layer 27 over seed material coating 30). Thus, seed material coating 30 acts as a "metal mask" that prevents removal of portions of second adhesion layer 27 that overlie surface 24 of via hole 20 while exposed portions of second adhesion layer 27 are removed.

Portions of dielectric layer 26 that overlie active surface 14 of substrate 12 may also be removed. Again, any suitable process may be used to remove material of dielectric layer 26. For example, when dielectric layer 26 is formed from parylene or TEFLON®, a known, so-called "plasma strip," process may be employed.

Once desired portions of dielectric layer 26 have been removed, portions of first adhesion layer 25 that overlie active surface 14 of substrate 12 may be removed. Any suitable processes may be used to remove these portions of first adhesion layer 25, including, but not limited to, the use of wet etchants, including wet etchants that will remove material of first adhesion layer 25 with selectivity over the material or materials that are present at active surface 14 of substrate 12.

Example 2

FIGS. 28 through 35 illustrate another example of a process that may be used to form via holes 20 in a substrate 12 and insulate, or passivate, surfaces 24 of via holes 20.

Figure 28:
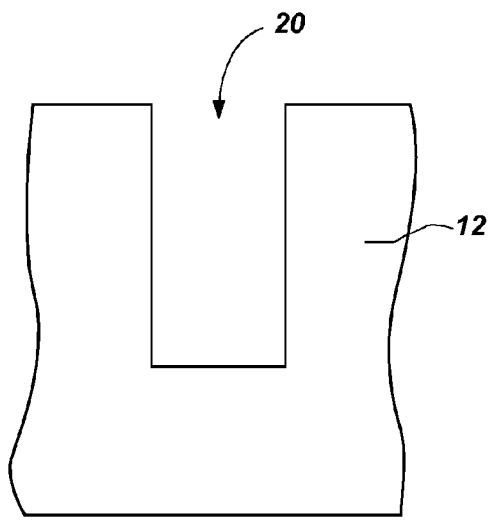
FIGS. 28 through 34 are cross-sectional representations of another example of a process for forming a via hole and coating surfaces of the via hole with dielectric material.

In FIG. 28, a via hole 20 is formed in substrate 12.

Figure 29:
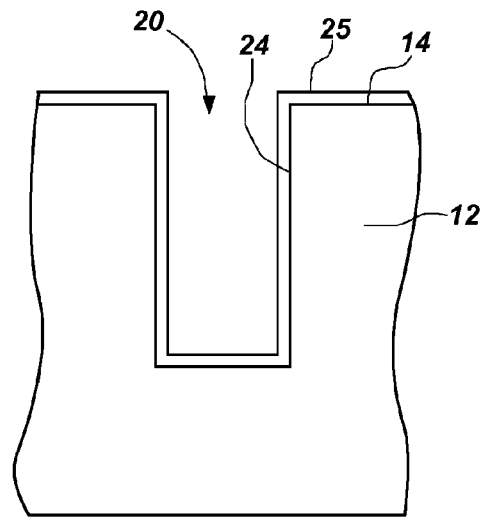
Figure 30:
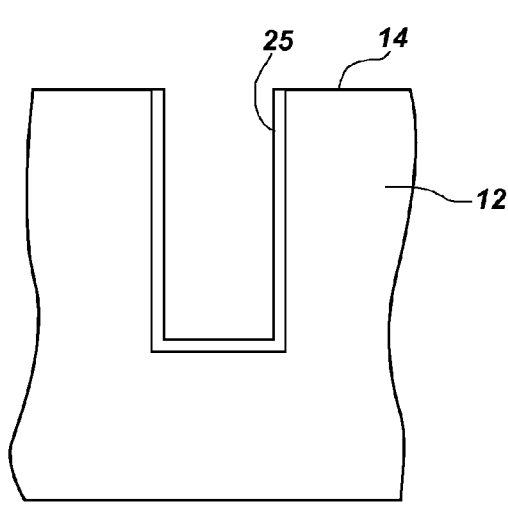

As shown in FIG. 29, a first adhesion layer 25 is formed on surface 24 of via hole 20 and on an active surface 14 of substrate 12. Portions of first adhesion layer 25 that overlie active surface 14 of substrate 12 are then immediately removed, as shown in FIG. 30.

Figure 31:
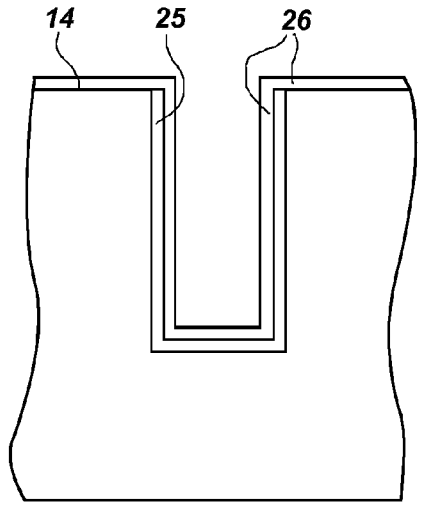
Figure 32:
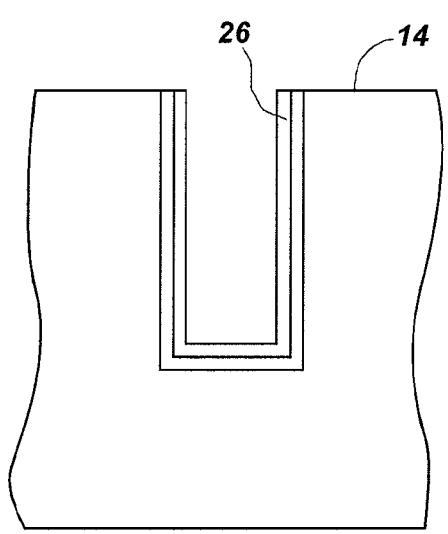

Next, as illustrated in FIG. 31, a layer 26 comprising low-K dielectric material is deposited over remaining portions of first adhesion layer 25 and over active surface 14. Thereafter, portions of dielectric layer 26 that overlie active surface 14 are removed, as depicted in FIG. 32.

Figure 33:
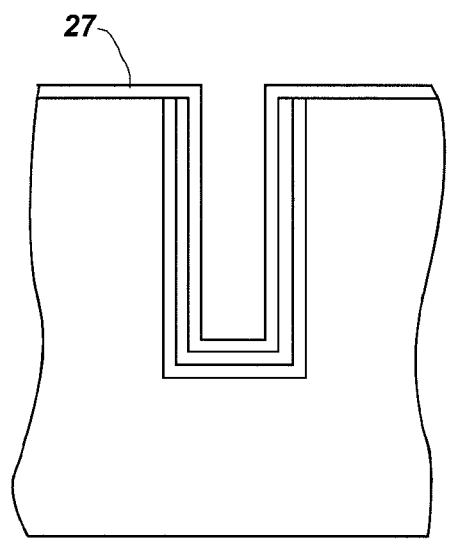
Figure 34:
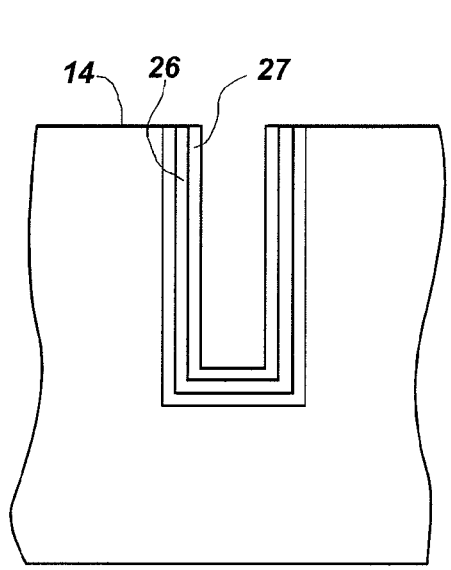

A second adhesion layer 27 is then formed, as shown in FIG. 33. Portions of second adhesion layer 27 that overlie active surface 14 are subsequently removed, while portions of second adhesion layer 27 that are adjacent to dielectric layer 26 remain, as shown in FIG. 34.

Figure 35:
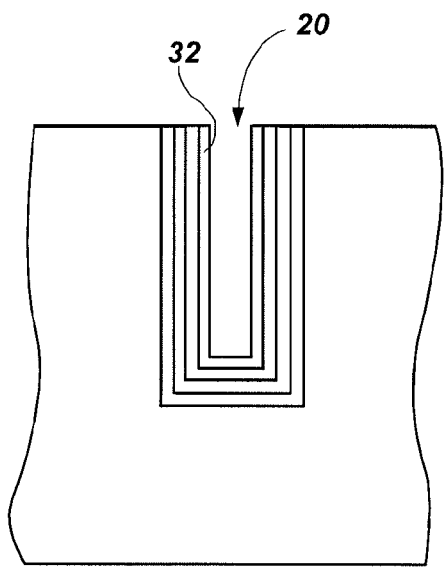
FIG. 35 depicts the formation of one or more conductive layers and underlying layers over the surfaces of the via hole shown in FIGS. 28 through 34.

Thereafter, as shown in FIG. 35, a conductive layer 32 and any underlying layers may be formed. Thereafter, any voids 34 remaining within via hole 20 may be filled, as described above in reference to FIGS. 16 through 19.

While FIGS. 28 through 35 depict the process of example 2 as being useful for forming conductive vias that extend through "blind" areas of substrate 12, which do not include integrated circuitry or bond pads, these processes may also be used to form conductive vias that extend through bond pads that are located over either blind or active areas of substrate 12.

Example 3

Figure 36:
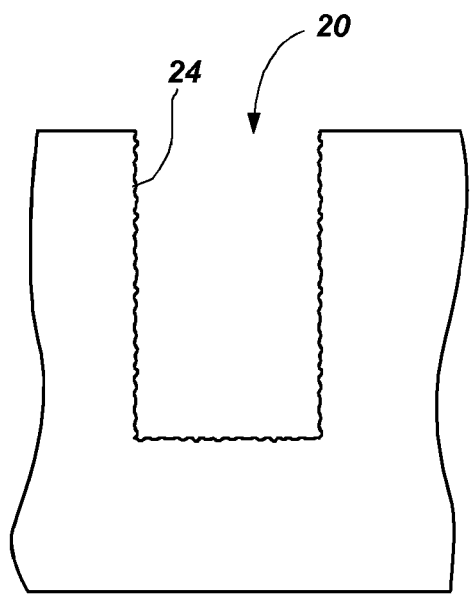
FIGS. 36 and 37 respectively show the formation of high surface area features, such as roughness features, on the surface of a via hole to enhance adhesion of materials thereto, and the subsequent formation of a dielectric layer over the high surface area surface of the via hole.
Figure 37:
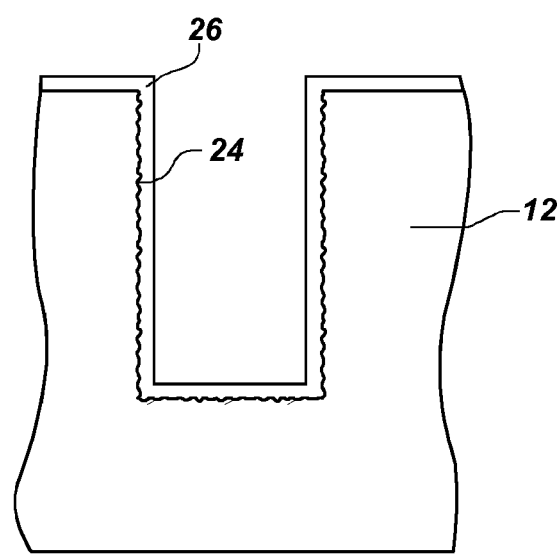

In another exemplary via hole formation and insulation technique, which builds upon the process flow described in examples 1 and 2, the first adhesion layer may be omitted and replaced with a process for roughening surface 24 of via hole 20, as shown in FIG. 36. Surface 24 may be roughened, for example, by the process or processes that are used to form via hole 20. Alternatively, a separate etch process may be used to increase the roughness of surface 24. The roughness of surface 24 enhances the direct adhesion of dielectric layer 26 or dielectric coating 28 (FIG. 5) to the material of substrate 12 at surface 24, as shown in FIG. 37.

Example 4

Figure 38:
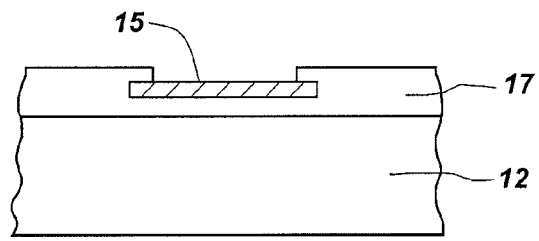
FIGS. 38 through 42 illustrate another example of a process for forming a via hole in a semiconductor device structure.

FIGS. 38 though 42 illustrate the formation of a via hole 20 (FIG. 42) through an upper bond pad 15 carried by substrate 12. When mask and etch techniques are employed to form via hole 20, a series of etch processes may be used. This is because the material of upper bond pad 15 differs from the material of underlying portions of a dielectric protective layer 17 and the material of substrate 12, over which protective layer 17 lies, and different etchants may be needed to remove these materials.

Figure 39:
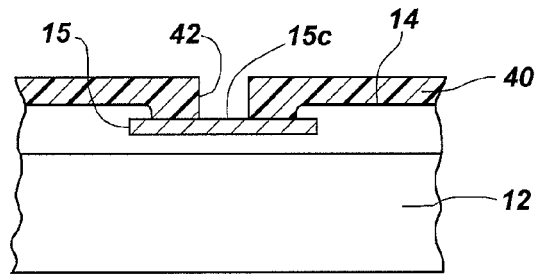

In FIG. 39, a mask 40 is formed over active surface 14 of substrate 12. Any suitable masking process may be used, including the formation of a photomask over active surface 14. An aperture 42 of mask 40 is positioned so as to facilitate material removal from a portion of upper bond pad 15. Aperture 42 may be located so that material may be removed from the center portions 15c of upper bond pad 15, or so that material removal will be effected from a location that is offset from the center portions 15c of upper bond pad 15.

Figure 40:
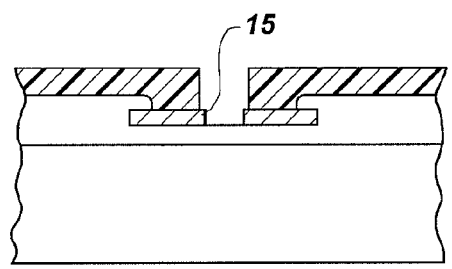

As shown in FIG. 40, material of upper bond pad 15 is removed. The removal of material of upper bond pad 15 may be effected with a single etch or, if necessary to remove multiple conductive layers, a plurality of etches. The removal process may be either isotropic or anisotropic, either wet or dry.

Figure 41:
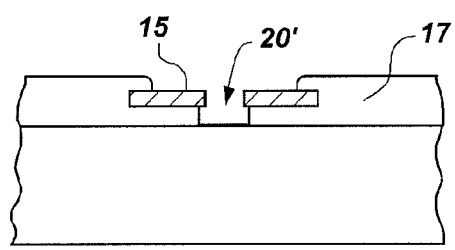

Once a portion of protective layer 17 that underlies upper bond pad 15 is exposed through upper bond pad 15, a material removal process that is suitable for removing the material of protective layer 17 is effected, as FIG. 41 illustrates. This protective layer 17-removal process may be isotropic or anisotropic, wet or dry.

Figure 42:
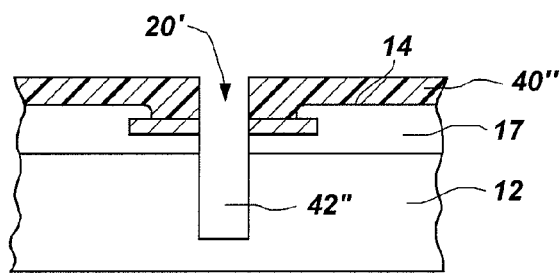

If necessary, another mask 40", such as a photomask, may be formed over active surface 14 to prevent the removal of material of protective layer 17 during subsequent processing, as illustrated in FIG. 42.

Portions of substrate 12 that are exposed through the opening 20' in upper bond pad 15 and protective layer 17, and through an aperture 42" of mask 40", may be exposed to an etchant to extend opening 20' into substrate 12 and, thus, to form a via hole 20 therein. While the etchant may be an isotropic etchant or an anisotropic etchant, a wet etchant or a dry etchant, it is notable that the use of an anisotropic etchant may maximize the aspect ratio of the resulting via hole 20.

Once via hole 20 has been formed, any resist remaining on substrate 12 may be removed therefrom, as known in the art (e.g., by use of suitable resist strip processing). The surface areas of surfaces 24 of each via hole 20 may be increased, as explained in example 3, and a dielectric coating 28 (not shown in FIGS. 38 through 42) may be fabricated over surfaces 24 of each via hole 20, as described in examples 1 and 2.

Alternatively, via hole 20 may be formed by other known processes (e.g., laser ablation).

Examples 5 through 8 describe various techniques and process flows for forming conductive layers within via holes 20.

Example 5

Referring now to FIGS. 43 through 46, an exemplary process for forming conductive vias that comprise copper conductive elements is described.

Figure 43:
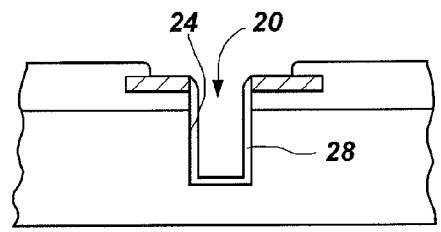
FIGS. 43 through 46 are cross-sectional representations of an example of a process for forming a copper conductive via within a via hole.

Once a via hole 20 has been formed, surfaces 24 thereof may be coated with one or more layers of dielectric material, as illustrated in FIG. 43, to form a dielectric coating 28 over surfaces 24. Processes such as those disclosed in examples 1 through 3 may be used to coat surfaces 24 of via holes 20 with dielectric material, as may any other suitable techniques.

Figure 44:
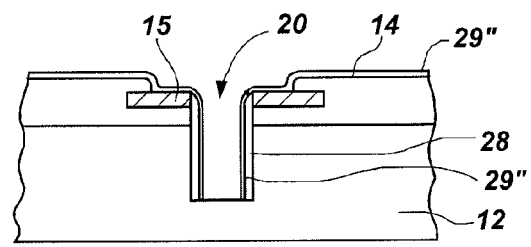

A copper barrier layer 29" (e.g., Ta, TaN, Ti, TiN, etc.) (e.g., about 150 Å thick) may then be formed, as depicted in FIG. 44. Copper barrier layer 29" overlies dielectric coating 28 and prevents undesirable interdiffusion between a subsequently formed copper conductive element and the material or materials of dielectric coating 28 or substrate 12. Examples of materials that may be used to form copper barrier layer 29" include, without limitation, titanium nitride, tantalum nitride, titanium, tantalum, and the like. These and other materials that act as a barrier between copper and silicon-containing materials may be deposited by known processes (e.g., CVD).

Portions of copper barrier layer 29" that overlie active surface 14 of substrate 12 are then removed. Known processes may be used to remove these portions of copper barrier layer 29", including, but not limited to, spacer etch processes and mask and etch processes. Following removal, and depending at least in part upon the type of removal process employed, portions of copper barrier layer 29" remain within via hole 20 and, optionally, over upper bond pad 15.

Figure 45:
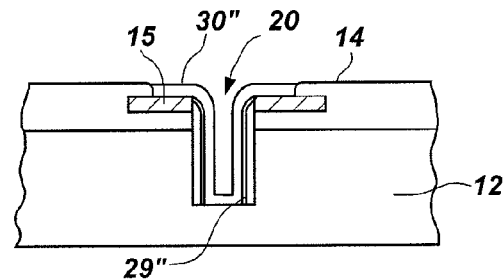

In FIG. 45, a seed material coating 30" of copper (e.g., about 2,000 Å thick) is formed on upper bond pads 15, over active surface 14 of substrate 12, and on portions of copper barrier layer 29" that remain within via holes 20. The copper of seed material coating 30" may be deposited by known processes, including CVD and PVD processes.

When blanket deposition processes are used to deposit the copper of seed material coating 30", portions of seed material coating 30" that overlie active surface 14 of substrate 12 are removed to prevent electrical shorting across active surface 14 (e.g., at locations between conductive vias or between a conductive via and a bond pad or other electrically conductive structures that are exposed to active surface 14). These portions of seed material coating 30" may be removed by any suitable process, including by known planarization or polishing processes (e.g., mechanical polishing, chemical-mechanical polishing, etc.), with a spacer etch or otherwise, as known in the art.

Figure 46:
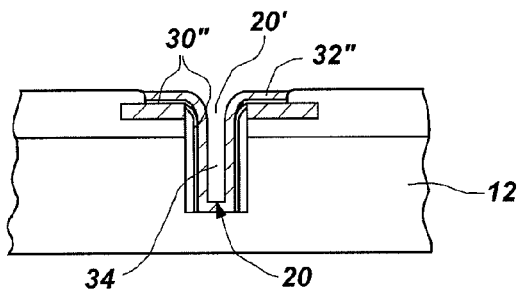

Next, as shown in FIG. 46, a conductive layer 32" (e.g., about 1 μm thick), which comprises copper, is formed over remaining portions of seed material coating 30". Conductive layer 32" may be formed selectively on seed material coating 30", without covering other regions of substrate 12 or features carried thereby. For example, known electroless plating, immersion plating, or electrolytic plating technologies, such as the chemistries available from Pac Tech, may be used to selectively deposit the copper of conductive layer 32".

Example 6

Figure 48:
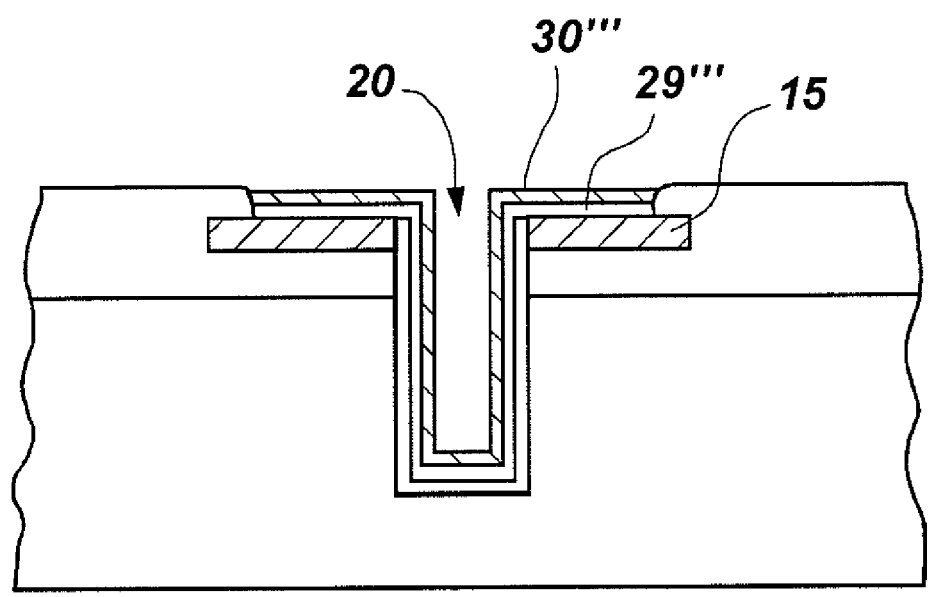
FIGS. 48 and 49 show another exemplary process for fabricating a copper conductive via within a via hole.
Figure 49:
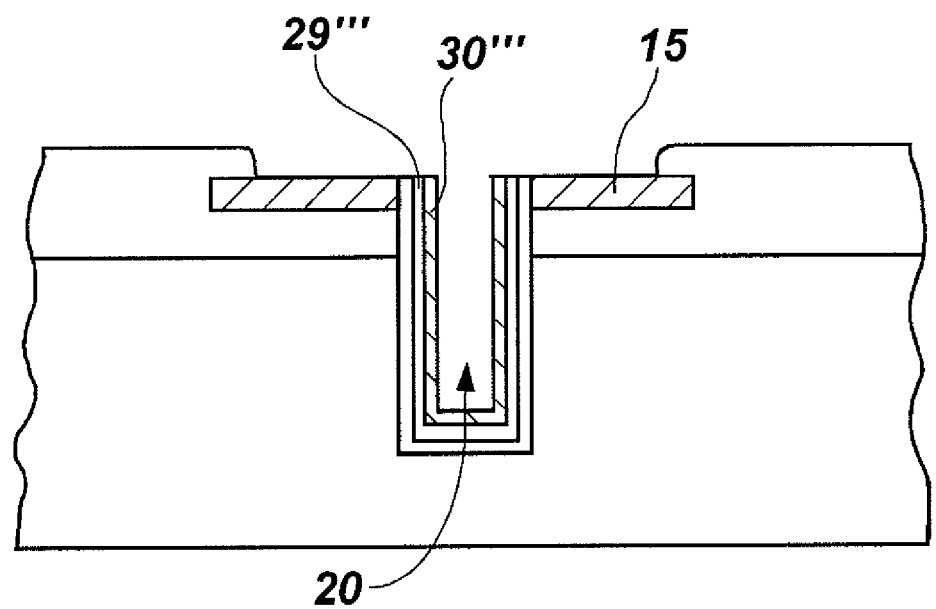

The process flow of example 5 may be modified somewhat, as shown in FIGS. 48 and 49. In FIG. 48, barrier layer 29''' remains completely intact as a seed material coating 30''' is formed thereover. Once seed material coating 30''' is formed, regions of both seed material coating 30''' and barrier layer 29''' that are not located within via hole 20 or over upper bond pad 15 are removed, as shown in FIG. 49. These portions of seed material coating 30''' and barrier layer 29''' may be removed by any suitable process or processes including, but not limited to, use of a polishing technique (e.g., CMP), a spacer etch, or the like.

Example 7

Turning now to FIGS. 50 through 53, an exemplary embodiment for forming a nickel conductive element in a via hole 20 is described.

Figure 50:
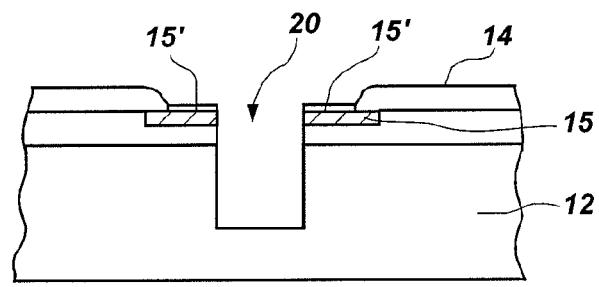
FIGS. 50 through 53 are schematic representations that illustrate an example of a process for fabricating a nickel conductive via within a via hole.

FIG. 50 shows a substrate 12 with an upper bond pad 15 carried by active surface 14 thereof. A nickel film 15' is plated onto upper bond pad 15 by known techniques, such as electroless, immersion, or electrolytic plating techniques. A via hole 20 is then formed through upper bond pad 15 and in substrate 12, by a suitable process, such as that described in examples 1 through 4.

Figure 51:
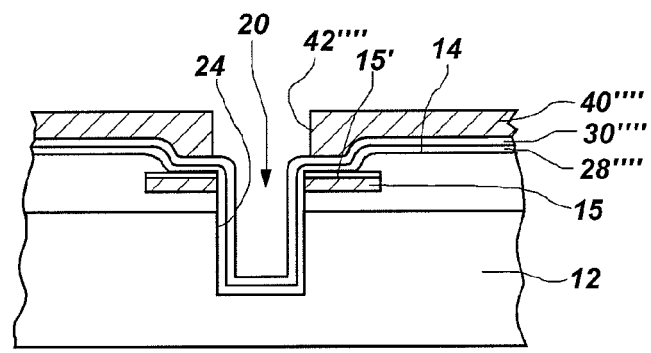

Thereafter, as shown in FIG. 51, a dielectric coating 28'''' is formed over surfaces 24 of via hole 20, on nickel film 15', and on active surface 14 of substrate 12. Dielectric coating 28'''' may include one layer (e.g., an oxide film formed by PLD or LSO) or more (e.g., a dielectric layer formed from a non-silicon-containing low-K material and one or more optional adhesion layers, as described in examples 1 and 2). Notably, dielectric coating 28'''' need not be etched or otherwise selectively removed prior to the subsequent deposition process. Optionally, a barrier layer 29 (not shown) may be formed over dielectric coating 28''''.

A seed material coating 30'''' is then formed over dielectric coating 28''''. Seed material coating 30'''', which may comprise copper, is formed on dielectric coating 28'''' by known processes, such as by CVD or PVD techniques. A mask 40'''', such as a photomask, may then be formed over seed material coating 30''''. Mask 40'''' includes an aperture 42'''' positioned relative to each via hole 20 so as to facilitate the introduction of material into via hole 20, but prevent the exposure of portions of seed material coating 30'''' that overlie remaining portions of upper bond pad 15 and active surface 14 to such material.

Figure 52:
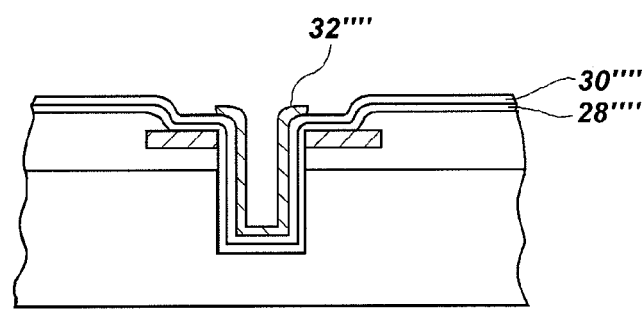

As FIG. 52 illustrates, following the formation of mask 40'''', nickel is plated onto portions of seed material coating 30'''' that are exposed through each aperture 42'''' to form a conductive layer 32'''' (e.g., having a thickness of about 3 μm to about 5 μm) thereover. Nickel plating may be effected by any suitable process, including, but not limited to, electroless plating techniques, immersion plating techniques, and electrolytic plating techniques. As illustrated, mask 40'''' limits the extent of conductive layer 32''''. Once conductive layer 32'''' has been formed, mask 40'''' may be removed by techniques that are known in the art. Any nickel remaining on mask 40'''' is lifted off as mask 40'''' is removed.

Figure 53:
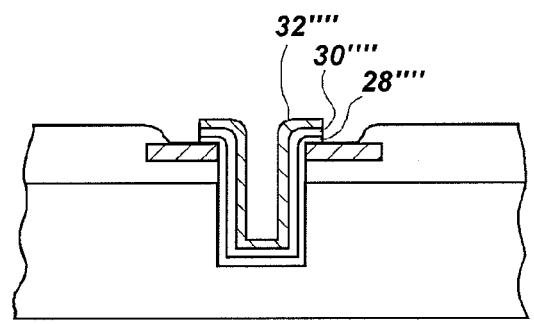

Conductive layer 32'''' may then serve as a mask for the removal of exposed portions of seed material coating 30'''' and, once these portions of seed material coating 30'''' are removed, for the removal of the subsequently exposed portions of dielectric coating 28'''', as shown in FIG. 53. Such removal may be effected by use of one or more etchants that remove the copper or other material of seed material coating 30'''' or the material or materials of dielectric coating 28'''' with selectivity over the nickel of conductive layer 32''''.

Example 8

Another technique for forming a nickel conductive element of a conductive via is described with reference to FIGS. 54 through 56.

Figure 54:
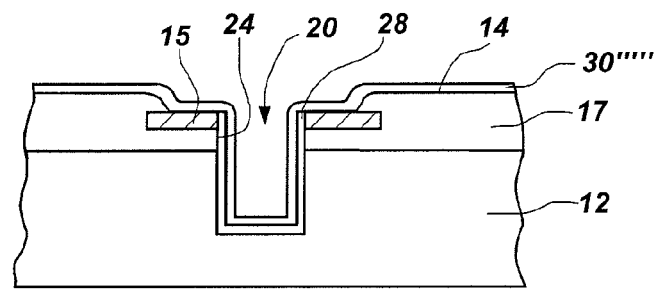
FIGS. 54 through 56 depict another exemplary process for forming a nickel conductive via within a via hole.

After a via hole 20 has been formed in active surface 14 of substrate 12 (e.g., through an upper bond pad 15 carried by active surface 14, as depicted), and a dielectric coating 28 has been formed over surfaces 24 of via hole 20 (e.g., by the process described in examples 1 and 2), a base layer comprising an aluminum film 30'''' is formed over active surface 14, upper bond pad 15, and dielectric coating 28, as shown in FIG. 54. The use of aluminum is desirable because of its low electrical resistivity and the ease with which aluminum films may be formed and patterned. Aluminum film 30'''' may be formed by known processes, including, without limitation, use of CVD and PVD techniques. These processes may be used to uniformly and conformally coat aluminum over exposed regions of upper bond pad 15 and over surfaces 24 of relatively deep (i.e., high aspect ratio) via holes 20.

Figure 55:
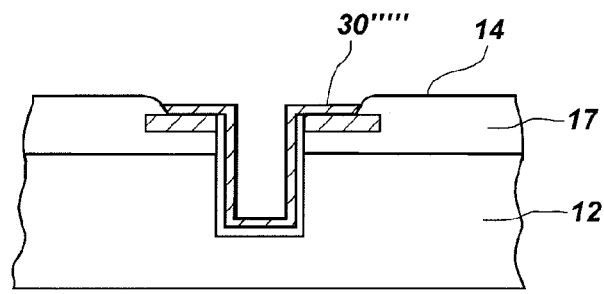

When blanket deposition processes are used to form aluminum film 30'''', portions of the aluminum film 30'''' that are located over active surface 14 of substrate 12 (e.g., on protective layer 17, as depicted), are removed, as FIG. 55 depicts. Such removal may be effected by suitable techniques; for example, with spacer etch or polishing processes.

Figure 56:
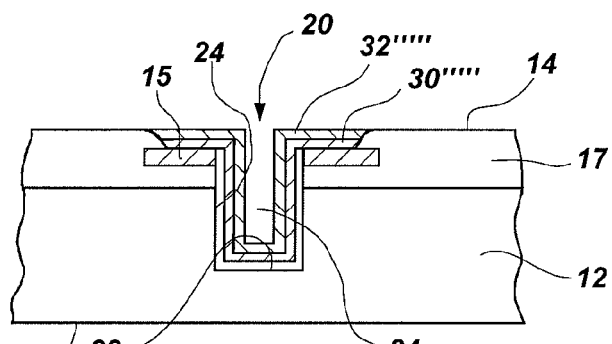

With reference to FIG. 56, remaining portions of aluminum film 30'''' may be coated with nickel. The nickel forms a conductive layer 32'''' over aluminum film 30''''. While any suitable nickel-deposition process may be employed to form conductive layer 32'''', if conductive layer 32'''' is formed by a selective deposition process, such as an electroless, immersion, or electrolytic plating process, the resulting conductive layer 32'''' will only coat exposed portions of seed material coating 30'''' and remaining portions of upper bond pad 15 and subsequent material removal processes will not be needed. In addition, when such processing is used, nickel may be applied to both upper bond pad 15 and over surface 24 of via hole 20 simultaneously, rather than separately.

As conductive layer 32'''' may extend over upper bond pad 15, it is not necessary to plate upper bond pad 15 with nickel or any other conductive material prior to the formation of conductive layer 32''''.

Example 9

Conductive features (e.g., portions of seed material coating 30'''', conductive layer 32'''', conductive filler 36 (e.g., a solder, such as tin/lead (Pb/Sn) solder, a so-called "lead-free solder," such as a copper/tin/silver (Cu/Sn/Ag), tin/copper (Sn/Cu), tin/silver (Sn/Ag), or gold/tin (Au/Sn) alloy, or other suitable conductive material), etc.) within each via hole 20 form a conductive via 38 through substrate 12. When these features are exposed to a back side 13 of substrate 12, they form a bottom bond pad 16 at back side 13 of substrate 12, as illustrated by FIG. 57.

When blind via holes 20 are formed and filled, blind end 22 of each via hole 20 may be exposed through a back side 13 of substrate 12 by any suitable process. For example, known back-grinding techniques or etching processes may be used to remove material from back side 13 and expose via hole 20 or structures therein to back side 13.

Example 10

Figure 57:
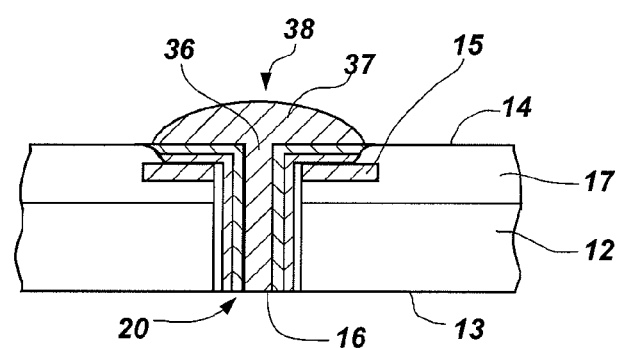
FIG. 57 shows examples of processes for exposing a blind end of a blind via hole and introducing conductive filler material into a void that remains within a via hole following fabrication of a conductive via.

With continued reference to FIG. 57, a void 34 (FIG. 56) that remains within a via hole 20 may be filled with conductive filler 36, such as a molten metal or metal alloy (e.g., solder). Conductive filler 36 may be applied to a surface 13, 14 of substrate 12 by any suitable process (e.g., in a bath, in a wave solder apparatus, etc.), and permitted to fill voids 34. Conductive filler 36 may, for example, be drawn into void 34 by capillary action. Alternatively, conductive filler 36 may be forced into via holes 20 under negative pressure, positive pressure, or mechanical force.

As shown, a conductive bump 37 may remain on upper bond pad 15. Alternatively, or in addition, a conductive bump could protrude relative to back side 13 of substrate 12. If desired, conductive bump 37 may be removed by known processes (e.g., by suitable etching processes).

Example 11

Figure 47:
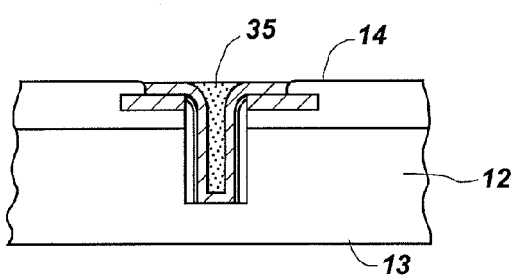
FIG. 47 depicts introduction of a dielectric filler into a void that remains within a via hole following fabrication of a conductive via.

Alternatively, as shown in FIG. 47, any void 34 (FIG. 46) that remains within a via hole 20 may be filled with a plug of an electrically nonconductive, or dielectric, filler material 35. By way of nonlimiting example, a liquid (e.g., molten, uncured, etc.) dielectric filler material 35 may be applied to active surface 14 of substrate 12 by any suitable technique (e.g., spin-on processes, spraying, etc.) and may be passively or actively (e.g., under pressure or force) introduced into void 34 to at least partially fill the same.

If necessary or desired, excess dielectric filler material 35 may be removed (e.g., with a suitable solvent or etchant) from one or both surfaces 13, 14 of substrate 12, as well as any features (e.g., upper bond pads 15) thereon.

Example 12

Figure 58:
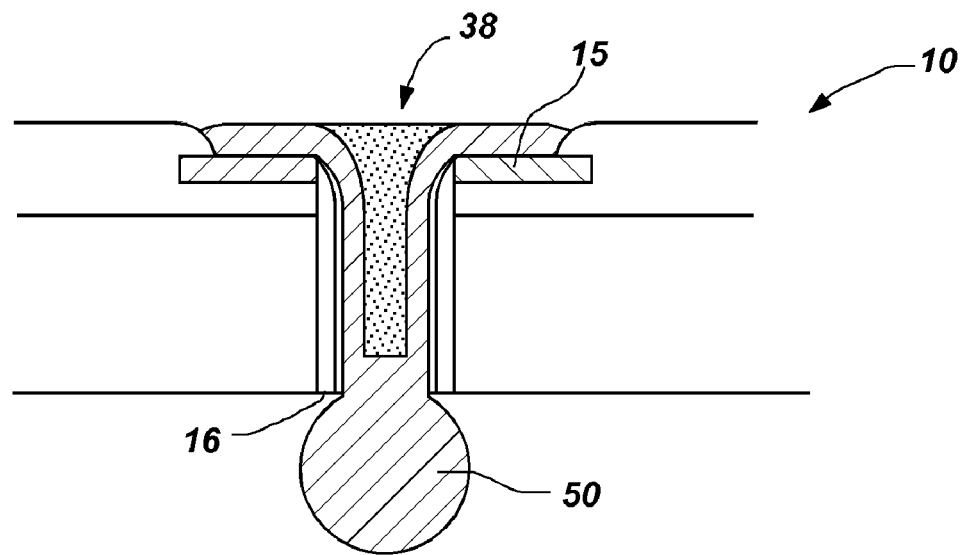
FIG. 58 is a cross-sectional representation showing a conductive structure that is secured to a conductive via at the back side of a semiconductor device structure.

Turning now to FIG. 58, electrical communication may be established with conductive vias 38 and, thus, with their corresponding upper bond pads 15 and circuitry (e.g., in the case where semiconductor device structure 10 is a semiconductor device, with integrated circuitry of the semiconductor device) that communicates with upper bond pads 15, by securing external conductive elements 50 to bottom bond pads 16. External conductive elements 50 may, by way of example only, comprise the illustrated balls or bumps of conductive material (e.g., metal, a metal alloy such as a solder, a conductive polymer, a conductor-filled polymer, etc.), conductive pins, pillars, or columns, or a so-called z-axis conductive film, which includes a dielectric film with conductive filaments extending only along the thickness, or z-axis, thereof.

Figure 59:
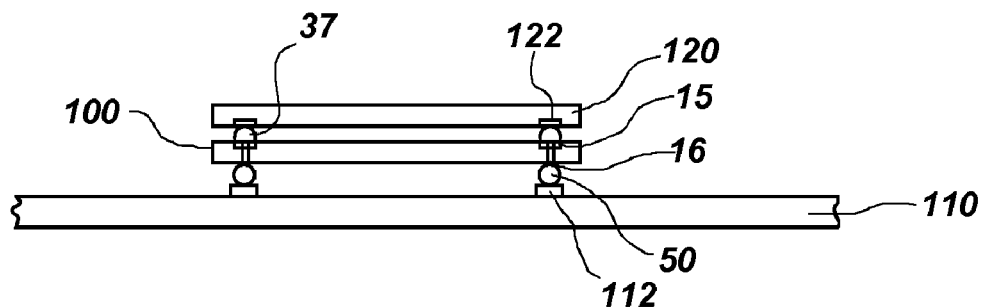
FIG. 59 is a schematic representation of an assembly that includes a semiconductor device structure that incorporates teachings of the present invention.

External conductive elements 50 may be used to electrically connect semiconductor device structure 10 to another electronic component. For example, as shown in FIG. 59, contacts (e.g., bottom bond pads 16) of semiconductor device structure 100 may be aligned with corresponding contacts 112 of another semiconductor device component 110, then the contacts (e.g., bottom bond pads 16) and their corresponding contacts 112 secured to one another, in electrical communication, with external conductive elements 50. The presence of separate contacts (e.g., upper bond pads 15) on the opposite surface of semiconductor device structure 100 facilitates the disposition, or "stacking," of another electronic component, such as the depicted semiconductor device component 120, over semiconductor device structure 100, with contacts 122 of the upper semiconductor device component 120 being aligned with and secured in electrical communication (e.g., with conductive bump 37) to corresponding contacts (e.g., upper bond pads 15) of the middle semiconductor device structure 100.

Other examples of assemblies in which semiconductor device structures 100 according to the present invention may be used are described in Farnworth, as are electronic devices within which semiconductor device structure 100 may be incorporated.

Although the foregoing description contains many specifics, these should not be construed as limiting the scope of the present invention, but merely as providing illustrations of some of the presently preferred embodiments. Similarly, other embodiments of the invention may be devised that do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein, which fall within the meaning and scope of the claims, are to be embraced thereby.

What is claimed is:

1. A semiconductor device structure, comprising:
    a substrate;
    at least one via hole extending partially through the substrate; and
    a dielectric coating over surfaces of the at least one via hole, the dielectric coating including:
        at least one adhesion material; and
        a dielectric material different from the at least one adhesion material and having a dielectric constant (K) of about 2.

2. The semiconductor device structure of claim 1, wherein the at least one adhesion material of the dielectric coating comprises an oxide.

3. The semiconductor device structure of claim 1, wherein the at least one adhesion material contacts surfaces of the at least one via hole.

4. The semiconductor device structure of claim 3, wherein the dielectric material coats the at least one adhesion layer.

5. The semiconductor device structure of claim 4, further comprising:
    another adhesion material different from the dielectric material and coating the dielectric material.

6. The semiconductor device structure of claim 1, wherein the at least one adhesion material coats the dielectric material.

7. The semiconductor device structure of claim 1, wherein the at least one via hole extends through a bond pad carried by the substrate.

8. The semiconductor device structure of claim 7, wherein the dielectric coating extends onto at least a portion of an edge of the bond pad that is continuous with the at least one via hole.

9. A semiconductor device structure, comprising:
    a substrate comprising semiconductor material;
    at least one via hole extending partially through semiconductor material of the substrate and including at least one roughened surface with an enhanced surface area; and
    a dielectric coating over the at least one roughened surface comprising a dielectric material having a dielectric constant (K) of about 2.

10. The semiconductor device structure of claim 9, wherein the at least one via hole extends through a bond pad carried by the substrate.

11. The semiconductor device structure of claim 10, wherein the dielectric coating extends onto at least a portion of an edge of the bond pad that is continuous with the at least one via hole.

12. The semiconductor device structure of claim 9, further comprising an aluminum material over the dielectric coating.

13. A semiconductor device structure, comprising:
a substrate comprising semiconductor material;
at least one via hole extending at least partially through semiconductor material of the substrate;
a dielectric coating over a surface of the at least one via hole, the dielectric coating including:
at least one adhesion material; and
a dielectric material different from the at least one adhesion material;
seed material on at least a portion of the dielectric coating over the surface of the at least one via hole; and
a conductive material different from and coating the seed material.

14. The semiconductor device structure of claim 13, wherein the dielectric coating comprises a low-K dielectric material.

15. The semiconductor device structure of claim 13, further comprising:
a barrier layer between the seed material and at least the portion of the surface of the at least one via hole.

16. The semiconductor device structure of claim 15, wherein the barrier layer comprises at least one of titanium, titanium nitride, tantalum, and tantalum nitride.

17. The semiconductor device structure of claim 13, wherein the conductive material comprises copper.

18. The semiconductor device structure of claim 13, wherein the seed material comprises aluminum.

19. The semiconductor device structure of claim 18, wherein the at least one via hole extends through a bond pad carried by the substrate.

20. The semiconductor device structure of claim 19, wherein the bond pad comprises an unplated bond pad.

21. The semiconductor device structure of claim 20, wherein the seed material contacts an unplated surface of the unplated bond pad.

22. The semiconductor device structure of claim 18, wherein the conductive material comprises nickel.

23. The semiconductor device structure of claim 13, further comprising:
a void between opposed surfaces of the conductive material.

24. The semiconductor device structure of claim 23, further comprising:
a polymeric dielectric filler material within the void.

25. The semiconductor device structure of claim 24, wherein a surface of the polymeric dielectric filler material is substantially coplanar with a surface of the substrate.

26. A semiconductor device structure, comprising:
a substrate;
at least one via hole extending at least partially through the substrate;
seed material on at least a portion of the surface of the at least one via hole;
a conductive material different from and coating the seed material;
a void between opposed surfaces of the conductive material; and
a polymeric dielectric filler material within the void.

27. The semiconductor device structure of claim 26, wherein a surface of the polymeric dielectric filler material is substantially coplanar with a surface of the substrate.

* * * * *